(12) United States Patent
Chia et al.

(10) Patent No.: US 11,129,311 B1
(45) Date of Patent: Sep. 21, 2021

(54) ELECTROMAGNETIC COMPATIBILITY GASKET AND VENT

(71) Applicant: Cisco Technology, Inc., San Jose, CA (US)

(72) Inventors: Vic Hong Chia, Sunnyvale, CA (US); George Edward Curtis, San Jose, CA (US); John David Stallings, Cedar Park, TX (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/826,557

(22) Filed: Mar. 23, 2020

(51) Int. Cl.
*H05K 7/20* (2006.01)
*H05K 9/00* (2006.01)
*H05K 5/02* (2006.01)
*H05K 1/02* (2006.01)

(52) U.S. Cl.
CPC ......... *H05K 9/0015* (2013.01); *H05K 1/0216* (2013.01); *H05K 5/0217* (2013.01); *H05K 5/0247* (2013.01); *H05K 7/20172* (2013.01); *H05K 2201/2036* (2013.01)

(58) Field of Classification Search
None
See application file for complete search history.

(56) References Cited

U.S. PATENT DOCUMENTS

| | | | |
|---|---|---|---|
| 7,486,508 B2 | 2/2009 | Liang | |
| 8,270,171 B2 | 9/2012 | Narasimhan et al. | |
| 9,173,331 B2 * | 10/2015 | Gerken | G06F 1/182 |
| 9,341,794 B1 * | 5/2016 | Curtis | G02B 6/4269 |
| 9,411,383 B2 | 8/2016 | Gong et al. | |
| 9,560,793 B2 | 1/2017 | Leigh et al. | |
| 9,933,555 B2 * | 4/2018 | Henry | G02B 6/008 |
| 10,431,914 B2 | 10/2019 | Curtis et al. | |
| 2013/0213909 A1 * | 8/2013 | Reynov | H05K 7/20 211/26 |
| 2014/0098492 A1 * | 4/2014 | Lam | H05K 7/20727 361/692 |
| 2016/0081220 A1 | 3/2016 | Chia et al. | |
| 2016/0128230 A1 * | 5/2016 | Lam | H05K 7/20727 361/695 |

FOREIGN PATENT DOCUMENTS

| | | |
|---|---|---|
| CN | 202171775 U | 3/2012 |
| CN | 205666271 U | 10/2016 |
| WO | 2017044825 A1 | 3/2017 |

* cited by examiner

*Primary Examiner* — Courtney L Smith
(74) *Attorney, Agent, or Firm* — Edell, Shapiro & Finnan, LLC

(57) ABSTRACT

A chassis-mounted electronic device includes a chassis, an upper EMI gasket, and a lower EMI gasket is provided. The chassis, including an upper chassis and a lower chassis, is constructed from a conductive sheet with a first thickness. The upper chassis and the lower chassis are coupled to form an interior of the chassis housing an electronic device. The upper EMI gasket is attached to the upper chassis, and is thinner than the upper chassis. The lower EMI gasket is attached to the lower chassis, and is also thinner than the lower chassis. The upper and lower EMI gaskets include perforations to allow cooling air through the EMI gaskets and into the interior of the chassis. Both the upper EMI gasket and the lower EMI gasket are configured to resiliently contact a portion of the electronic device to provide EMI shielding for the electronic device.

20 Claims, 6 Drawing Sheets

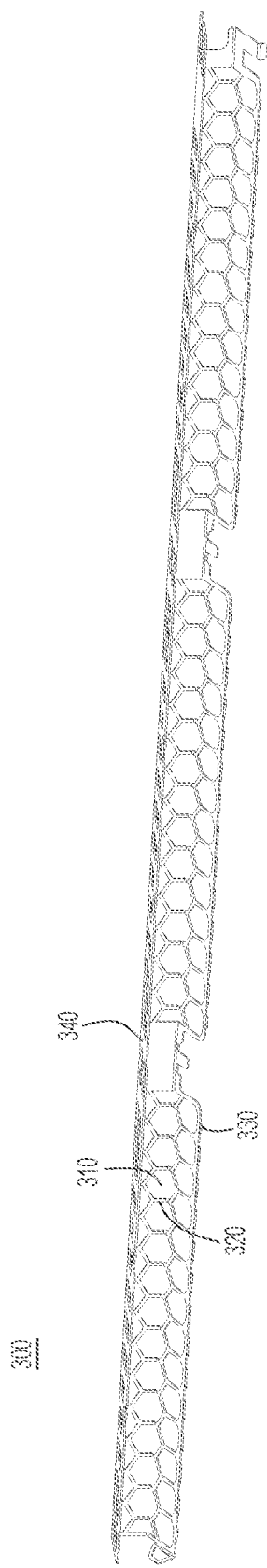
FIG.3A
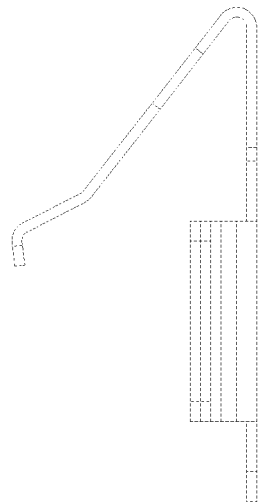
FIG.3C
FIG.3B

ELECTROMAGNETIC COMPATIBILITY GASKET AND VENT

TECHNICAL FIELD

The present disclosure relates to cooling and electromagnetic compatibility of electronic devices.

BACKGROUND

Chassis-mounted electronic devices, such as network equipment, typically bring a large number of electronic devices in close proximity, which may lead to issues with heat management and Electro-Magnetic Interference (EMI) management. The heat generated by the chassis-mounted electronic devices is typically managed by drawings cooling air through the chassis, which is most effective with large open spaces in the chassis. In contrast, EMI management relies on the chassis providing a Faraday cage to contain stray electromagnetic emitted from the electronic devices in the chassis, which is compromised by large openings in the chassis.

BRIEF DESCRIPTION OF THE DRAWINGS

FIG. 3A illustrates an EMI gasket that enables increased airflow, according to an example embodiment.

FIGS. 3B and 3C show cross-sectional views of an EMI gasket, according to example embodiments.

DESCRIPTION OF EXAMPLE EMBODIMENTS

Overview

Figure 1:
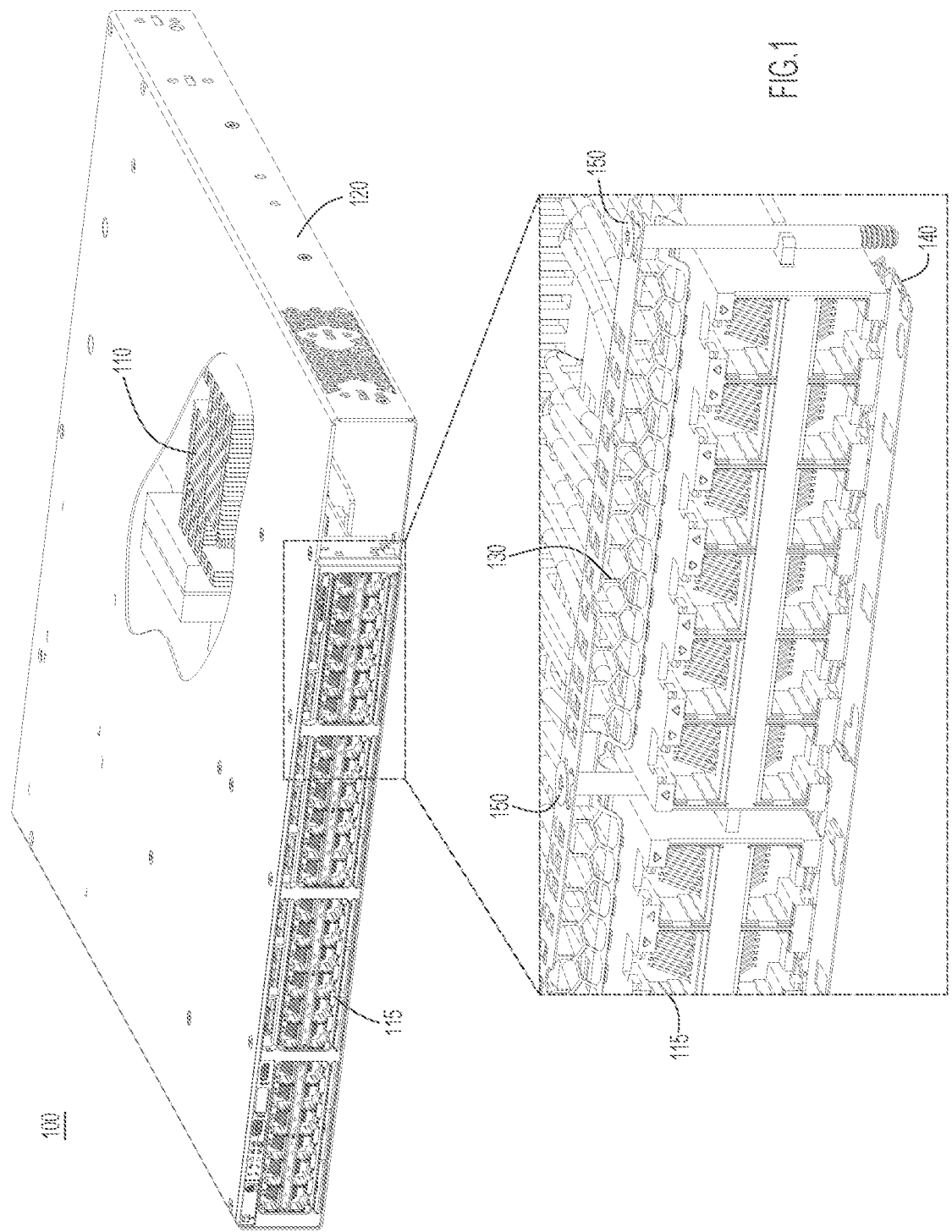
FIG. 1 is a diagram of an electronic device configured with an EMI gasket, according to an example embodiment.

In one form, an apparatus is provided comprising a chassis, an upper EMI gasket, and a lower EMI gasket is provided. The chassis comprises an upper chassis and a lower chassis that are constructed from a conductive sheet with a first thickness. The upper chassis and the lower chassis are coupled to form an interior of the chassis housing an electronic device. The upper EMI gasket is attached to the upper chassis, and has a second thickness that is less than the first thickness. The upper EMI gasket includes perforations to allow cooling air through the upper EMI gasket and into the interior of the chassis. The lower EMI gasket is attached to the lower chassis, and also has a second thickness that is less than the first thickness. The lower EMI gasket includes perforations to allow cooling air through the lower EMI gasket and into the interior of the chassis. Both the upper EMI gasket and the lower EMI gasket are configured to resiliently contact a portion of the electronic device to provide EMI shielding for the electronic device.

Example Embodiments

As the market for chassis-mounted electronic devices, such as network switches and routers, progresses into producing higher volumes, the landscape for providing an enterprise switch moves from simply providing performance and features to incorporating a measure of value and cost. In a high volume manufacturing environment, a relatively small cost to add a feature to a single unit can lead to significant costs when multiplied over a yearlong manufacturing run. Leveraging and reusing common units, such as fans, heatsinks, and power supplies, may provide cost savings, but indirectly lead to a thermal bottleneck when a system is upgraded with a next generation, high heat flux Application Specific Integrated Circuit (ASIC). In addition to generating additional heat, smaller and denser ASICs may have stricter constraints on a maximum long-term temperature. The combination of denser ASICs and the reuse of common units designed for previous generations lead to thermal challenges. The techniques described herein provide for increased airflow to deal with the increased heat in a cost effective manner, rather than redesigning the commonly used fan units or applying exotic heat sink solutions.

Additionally, a manual assembly line presents a challenge to lowering the unit cost of high volume manufacturing due to the overhead burden and quality issues, such as human error. Automation of an assembly line aims to mitigate human factors in the assembly line to reduce the unit cost in a high volume manufacturing environment. The techniques described herein enable increased automation in the assembly of chassis-mounted electronic devices by reducing the complexity of the assembly process (e.g., replacing complex placement of components in favor of linear pick and place motion).

Existing solutions for increasing the airflow through a chassis-mounted electronic device (e.g., slanting the faceplate of the chassis to provide more vent holes, precision machining to increase the percentage of the front faceplate that can open for vent holes, or directing airflow through larger openings in the faceplate and additional smaller vent holes within the chassis) present additional constraints in cost and ease of manufacturing. Exotic solutions to thermal management (e.g., vapor chambers or three dimensional heat pipes) typically raise the cost of producing the chassis-mounted device to unprofitable levels.

Referring now to FIG. 1, a chassis-mounted network device 100 is shown. Though the figures presented herein describe a network device, any chassis-mounted electronic device may benefit from the techniques described herein, and the specific embodiment of a chassis-mounted network device is used as an example. The network device 100 includes electronics 110 that are enclosed within the chassis 120 and ports 115 that provide access to the enclosed electronics 110 from outside the chassis 120.

In the magnified portion of FIG. 1, the chassis 120 has made transparent for clarity in depicting additional portions of the network device 100. An upper Electro-Magnetic Interference (EMI) gasket 130 is shown that connects the frame of the ports 115 to the chassis. A lower EMI gasket 140 also connects the frame of the ports 115 to the chassis. The upper EMI gasket and the lower EMI gasket 140 include perforations that allow cooling air to enter the chassis 120 above and below the ports 115. Bolts 150 securely connect the portions of the network device 100 within the chassis 120. Once the bolts 150 have fastened the upper EMI gasket 130, the lower EMI gasket 140, and the ports 115 to the chassis 120, a Faraday cage encloses the electronics 110 and mitigates stray electromagnetic radiation from the electronics 110.

In one example, the chassis 120 may be split into an upper chassis and a lower chassis that are fastened together to provide structural support for the electronics 110. The chassis 120 may be manufactured from sheets of conductive material (e.g., stainless steel) to form a portion of a Faraday cage providing EMI shielding for the electronics 110. Additionally, the chassis 120 may include standoffs to support one or more boards of the electronics 110 or other components housed within the chassis 120. The material of the sheet(s) forming the chassis 120 is of sufficient thickness (e.g., 2 mm of stainless steel) to provide structural support for the network device 100.

In another example, the upper EMI gasket 130 and the lower EMI gasket 140 may be manufactured from a sheet of relatively thin conductive material (e.g., 0.25 mm of stainless steel) in comparison to the sheet material forming the chassis 120. Perforations may be stamped into the upper EMI gasket 130 and the lower EMI gasket 140 to allow cooling air to flow into the interior of the chassis 120. The upper EMI gasket 130 and the lower EMI gasket 140 may also be curved to provide a spring resilience between the chassis 120 and the frame of the ports 115 when the chassis 120 is assembled.

Figure 2:
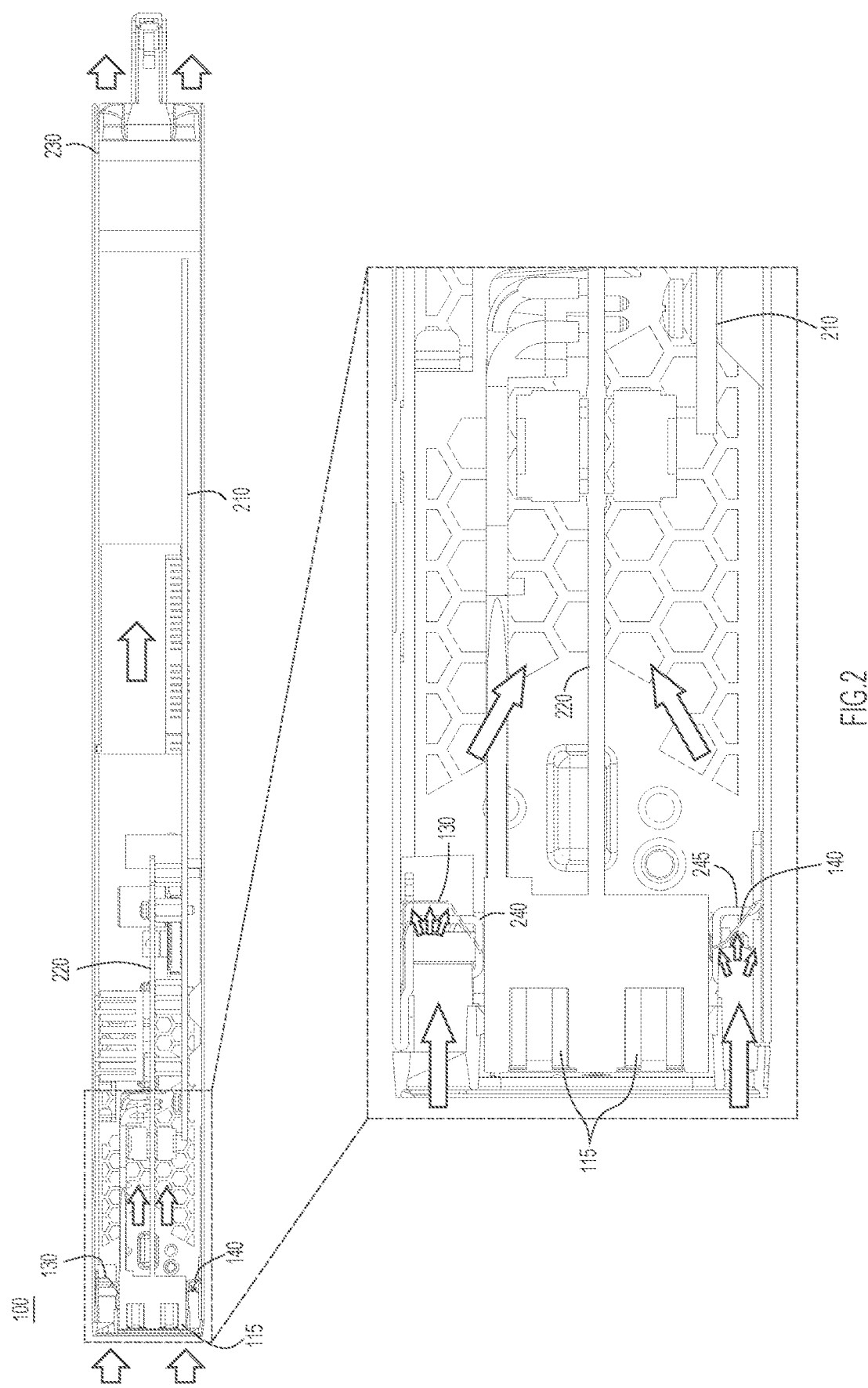
FIG. 2 is a side view of an electronic device that illustrates the airflow through the device, according to an example embodiment.

Referring now to FIG. 2, a side view of the network device 100 is shown with an example of the airflow through the interior of the chassis 120 cooling the electronics 110. A portion of the electronics 110 are disposed on a main board 210 enclosed completely by the chassis 120. Another portion of the electronics 110 are disposed on a daughtercard 220 that includes the ports 115. A fan 230 draws air through the upper EMI gasket 130 and the lower EMI gasket 140 into the interior of the chassis 120.

The magnified portion of FIG. 2 illustrates specific features of the chassis support and airflow through the front of the network device 100. The chassis 120 includes an upper standoff 240 and a lower standoff 245 that are configured to position the ports 115 on the daughtercard 220 to allow airflow above and below the daughtercard 220. In one example, the upper standoff 240 is manufactured from the same material as the upper component of the chassis 120. Similarly, the lower standoff 245 may be manufactured from the same material as the lower component of the chassis 120. The upper EMI gasket 130 and the lower EMI gasket 140 (shown in cross-section in FIG. 2) are curved to allow the air to flow through the EMI gaskets in multiple locations and directions. The curved-cross section of the EMI gaskets also provides a spring force to ensure good electrical contact between the chassis 120 and the frame surrounding the ports 115. In another example, the main board 210 may be positioned away from the front of the network device 100 to prevent the main board 210 from constricting the air flowing through the lower EMI gasket 140.

Referring now to FIG. 3A, an example of an EMI gasket 300 is shown. The EMI gasket 300 may be the upper EMI gasket 130 or the lower EMI gasket 140, as shown in FIG. 1 and FIG. 2. The EMI gasket 300 includes perforations 310 separated by a web 320 of metal. The EMI gasket 300 also includes fingers 330 configured to contact the frame of the electronics extending out of the chassis (e.g., ports 115) at multiple points to ensure good electrical contact along the length of the EMI gasket 300. The EMI gasket 300 further includes at least one space 340 to allow a connecting bolt (e.g., bolt 150 shown in FIG. 1) to secure the chassis in place around the electronic components.

In one example, the EMI gasket 300 may be manufactured by punching the perforations 310 from a thin metal strip. In typical sheet metal manufacturing process, the width of the web 320 is constrained by the thickness of the base sheet metal to ensure the integrity of the finished product. For instance, the web 320 may be constrained to being approximately twice the thickness of the sheet metal. The EMI gasket 300 may be made from a sheet metal that is sufficiently thin to allow the perforations 310 to cover at least 90% of the EMI gasket 300. In contrast, the chassis provides structural support for the entire device, and is manufactured from thicker sheet metal. The thinner sheet metal of the EMI gasket enables a thinner web 320 than an array of vent holes punched into the chassis itself, and allows for a greater surface area to be covered with perforations 310.

In another example, the EMI gasket 300 is curved to provide a spring resilience between the chassis (e.g., chassis 120) and the frame of the electronics extending out of the chassis (e.g., ports 115). The curve in the EMI gasket may be discrete or continuous, and may include convex or concave shapes. FIG. 3B shows a cross-sectional view of one example of the curve in the EMI gasket 300. FIG. 3C shows a cross-sectional view of another example of a more complex curve in the EMI gasket 300. Referring back to FIG. 1 and FIG. 2, the curve in the upper EMI gasket 130 may be different than the curve in the lower EMI gasket 140. Alternatively, the two EMI gaskets may have the same cross-sectional curve.

Figure 4:
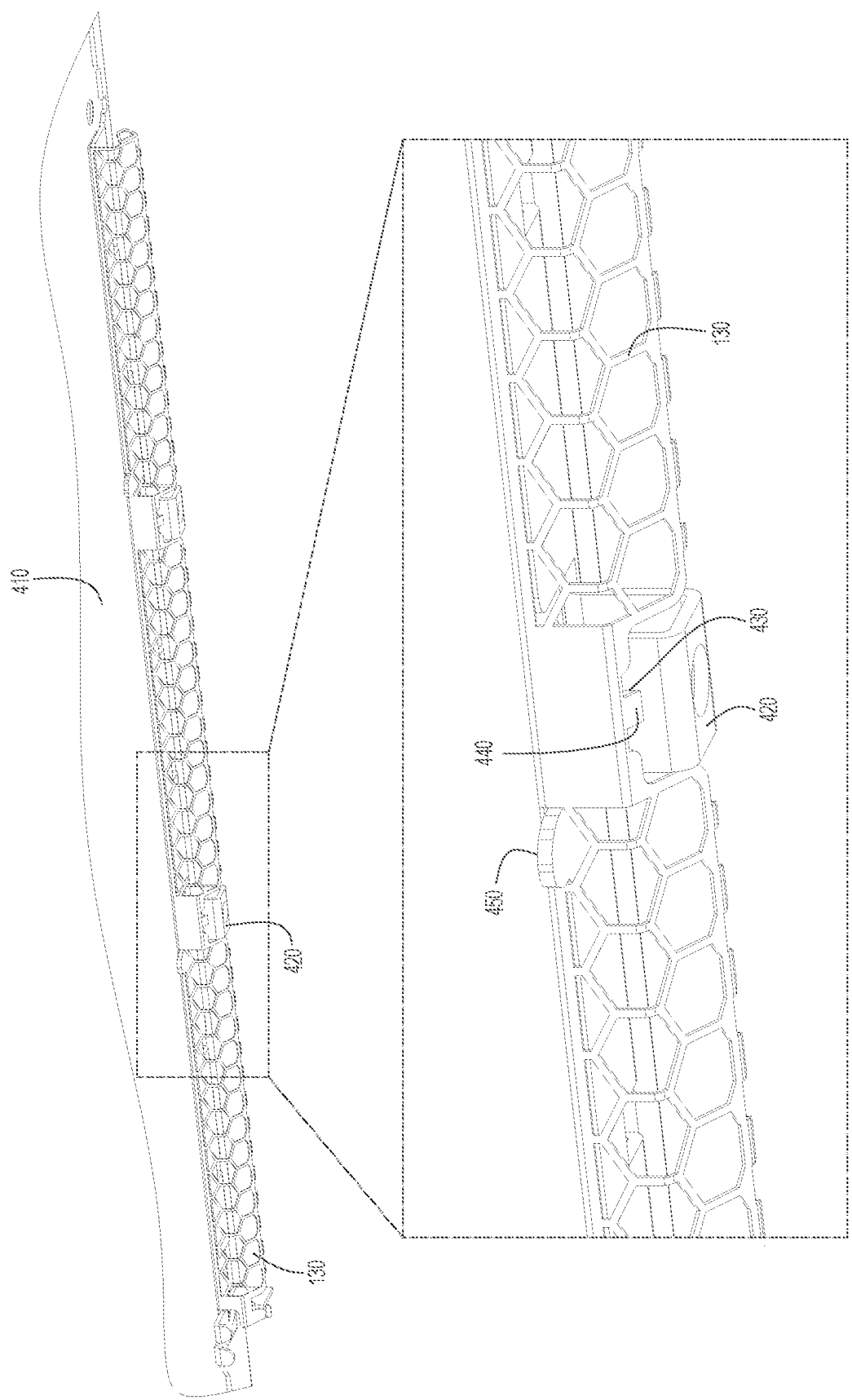
FIG. 4 illustrates the attachment of an upper EMI gasket to an upper chassis, according to an example embodiment.

Turning now to FIG. 4, an example of pre-mounting the upper EMI gasket 130 on the chassis is shown. Before the chassis-mounted electronic device (e.g., network device 100 shown in FIG. 1) is assembled, the upper EMI gasket 130 is attached to an upper chassis 410. The upper chassis 410 includes standoffs 420 that position the electronics that extend out of the chassis (e.g., ports 115 shown in FIG. 1). As shown in the magnified portion of FIG. 4, the upper EMI gasket 130 is fastened to the upper chassis 410 through the standoffs 420. The standoffs 420 include a slot 430 that matches a locking tab 440 that is formed on the upper EMI gasket 130. Additional support for the upper EMI gasket 130 is provided by fingers 450, which are part of the upper chassis 410.

Figure 5:
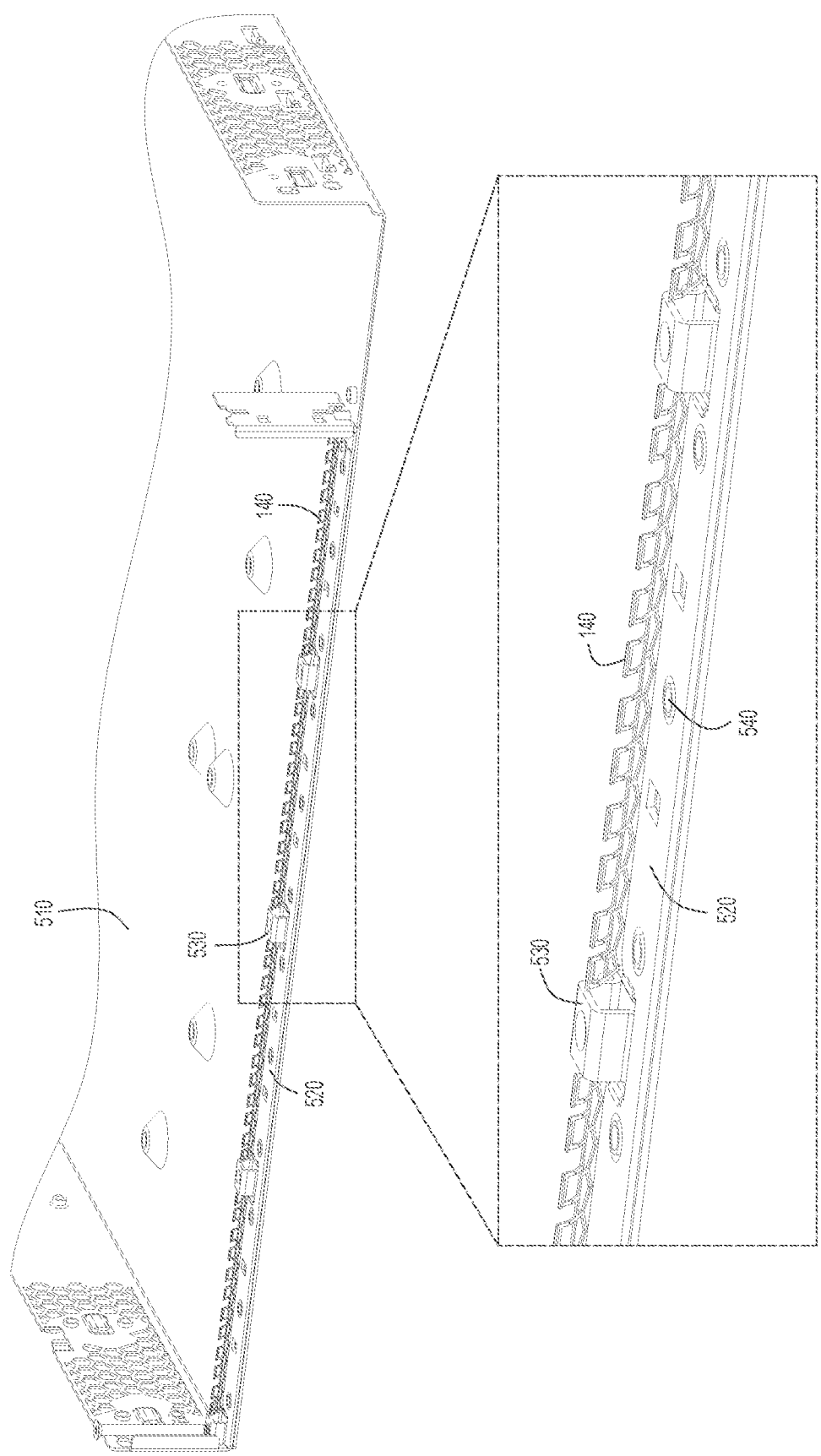
FIG. 5 illustrates the attachment of a lower EMI gasket to a lower chassis, according to an example embodiment.

Referring to FIG. 5, an example of pre-mounting the lower EMI gasket 140 on a lower chassis 510 is shown. The lower EMI gasket 140 is placed on the lower chassis 510 and held in place by a chassis bracket 520. The chassis bracket 520 includes standoffs 530 that position the electronics that extend out of the chassis (e.g., ports 115 shown in FIG. 1). As shown in the magnified portion of FIG. 5, a swaged connection 540 fastens the chassis bracket 520 to the lower chassis 510 and secures the lower EMI gasket 140 between the chassis bracket 520 and the lower chassis 510.

Combining the upper chassis 410 shown in FIG. 4 (i.e., pre-mounted with the upper EMI gasket 130) with the lower chassis 510 shown in FIG. 5 (i.e., pre-mounted with the lower EMI gasket 140) enables a simplified assembly process of the network device shown in FIG. 1. With the pre-assembled chassis components, the final assembly of the chassis may be completed with pick and place automation. This automation removes human factors and leads to higher quality and lower unit cost of the electronic device.

Figure 6:
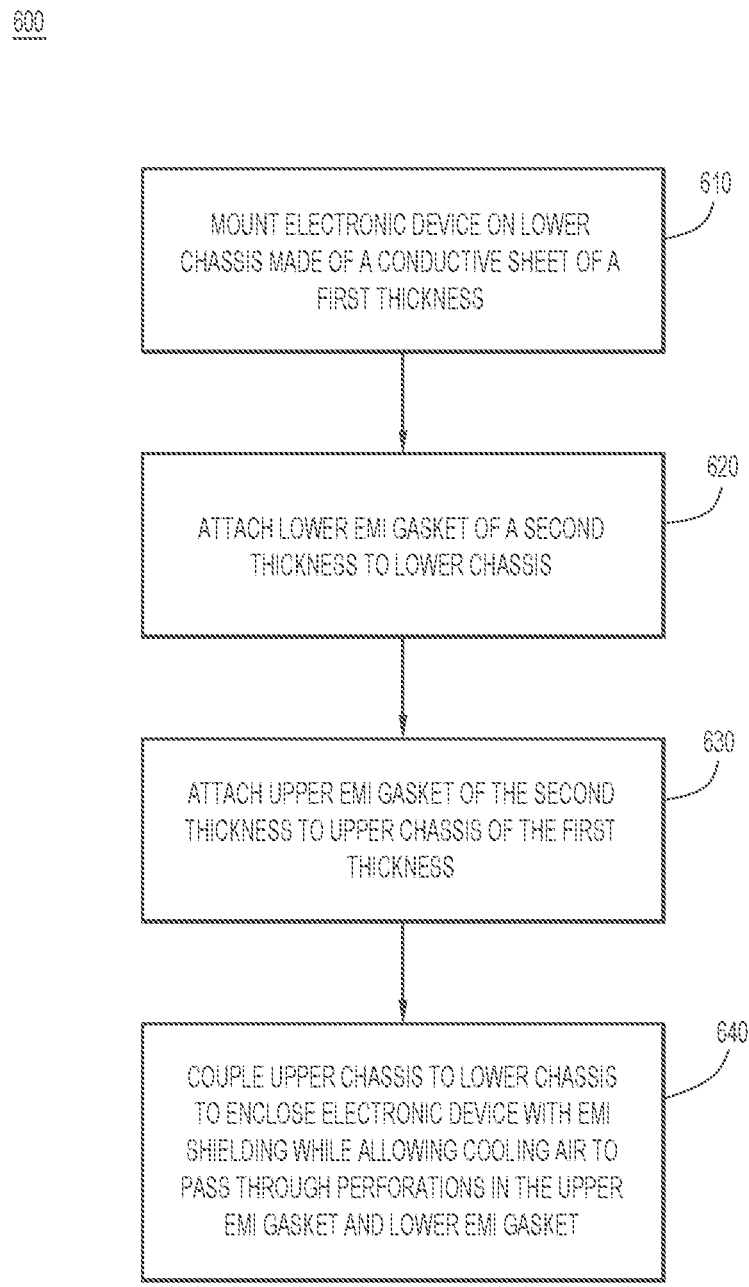
FIG. 6 is a flowchart illustrating operations for assembling an electronic device in a chassis with EMI gaskets, according to an example embodiment.

Referring now to FIG. 6, a flowchart is shown that depicts operations in an example process 600 of assembling a chassis-mounted electronic device. At 610, an electronic device is mounted on a lower chassis constructed of a conductive sheet of a first thickness. In one example, the lower chassis is constructed primarily from a stainless steel sheet that is approximately 2 mm thick. Alternatively, the lower chassis may be constructed from other materials (e.g., aluminum) with a range of thicknesses (e.g., 1-5 mm) that is sufficient to provide structural support to the electronic device.

At 620, a lower EMI gasket is attached to the lower chassis. The lower EMI gasket has a second thickness that is less than the first thickness. In one example, the lower EMI gasket may be constructed from a sheet of stainless steel that is approximately 0.25 mm thick. Additionally, the lower EMI gasket includes perforations to allow cooling air through the lower EMI gasket. In one example, the perforations cover at least 90% of the lower EMI gasket to ensure sufficient airflow to cool the electronic device.

At 630, an upper EMI gasket is attached to an upper chassis. The upper chassis has a first thickness to provide structural support for the assembled electronic device. In one example, the upper chassis is constructed primarily from a stainless steel sheet that is approximately 2 mm thick. Alternatively, the upper chassis may be constructed from other materials (e.g., aluminum) with a range of thicknesses (e.g., 1-5 mm) that is sufficient to provide structural support to the electronic device. The upper EMI gasket has a second thickness that is less than the first thickness. In one example, the upper EMI gasket may be constructed from a sheet of stainless steel that is approximately 0.25 mm thick. Additionally, the upper EMI gasket includes perforations to allow cooling air through the upper EMI gasket. In one example, the perforations cover at least 90% of the upper EMI gasket to ensure sufficient airflow to cool the electronic device.

At 640, the upper chassis and the lower chassis are coupled together to enclose the electronic device. The upper EMI gasket and the lower EMI gasket are configured to resiliently contact a portion of the electronic device to provide EMI shielding for the electronic device, while allowing cooling air to pass through the perforations in the upper EMI gasket and the lower EMI gasket. In one example, the upper chassis and lower chassis are connected by bolts that are electrically connected to the upper EMI gasket and the lower EMI gasket. The bolts connecting the upper chassis and the lower chassis may be conductive to provide further EMI shielding to the electronic device.

In summary, the techniques presented herein provide a system layout that maximizes airflow through EMI gaskets to achieve maximum cooling while providing EMI isolation. The increased airflow disrupts the need for exotic thermal solutions (e.g., designed heat sinks, expensive/complex faceplate design, high performance fans) to provide additional cooling as ASIC components evolve in density and heat production. The techniques enable the reuse of common components (e.g., heatsinks, fans, etc.) from legacy platforms to the latest generation platform, which directly translates to higher volume production at a lower unit cost. Additionally, the overall system layout of top down linear integration sequences enable the deployment of robotic automation to improve quality and lower labor dependence, resulting in lower unit costs.

The EMI gasket design provides continuous effective contact between the metal chassis and the metal frame of ports extending from the chassis, while providing increased airflow through the perforations covering at least 90% of the EMI gasket. The EMI gasket provides a cost effective solution that targets multiple challenges, such as cooling, EMI shielding, design for cost, design for automation and quality in high volume system production.

In one form, an apparatus comprising a chassis, an upper EMI gasket, and a lower EMI gasket is provided. The chassis comprises an upper chassis and a lower chassis that are constructed from a conductive sheet with a first thickness. The upper chassis and the lower chassis are coupled to form an interior of the chassis housing an electronic device. The upper EMI gasket is attached to the upper chassis, and has a second thickness that is less than the first thickness. The upper EMI gasket includes perforations to allow cooling air through the upper EMI gasket and into the interior of the chassis. The lower EMI gasket is attached to the lower chassis, and also has a second thickness that is less than the first thickness. The lower EMI gasket includes perforations to allow cooling air through the lower EMI gasket and into the interior of the chassis. Both the upper EMI gasket and the lower EMI gasket are configured to resiliently contact a portion of the electronic device to provide EMI shielding for the electronic device.

In another form, a system comprising a chassis, an electronic device, a fan, an upper EMI gasket, and a lower EMI gasket is provided. The chassis comprises an upper chassis and a lower chassis that are constructed from a conductive sheet with a first thickness. The electronic device comprises a motherboard disposed in the interior of the chassis and a daughterboard including a plurality of ports accessible from outside the chassis. The upper chassis and the lower chassis are coupled to form an interior of the chassis housing an electronic device. The fan is configured to draw cooling air into the interior of the chassis and cool the electronic device. The upper EMI gasket is attached to the upper chassis, and has a second thickness that is less than the first thickness. The upper EMI gasket includes perforations to allow the cooling air through the upper EMI gasket and into the interior of the chassis. The lower EMI gasket is attached to the lower chassis, and also has a second thickness that is less than the first thickness. The lower EMI gasket includes perforations to allow the cooling air through the lower EMI gasket and into the interior of the chassis. Both the upper EMI gasket and the lower EMI gasket are configured to resiliently contact the daughterboard to provide EMI shielding for the electronic device.

In still another form, a method for assembling an electronic device within a chassis is provided. The method includes mounting the electronic device on a lower chassis constructed of a conductive sheet of a first thickness. The method also includes attaching a lower EMI gasket to the lower chassis. The lower EMI gasket has a second thickness that is less than the first thickness. The lower EMI gasket also includes perforations to allow cooling air through the lower EMI gasket. The method further includes attaching an upper EMI gasket having a second thickness to an upper chassis having a first thickness. The upper EMI gasket also includes perforations to allow cooling air through the upper EMI gasket. The method also includes coupling the upper chassis to the lower chassis to enclose the electronic device. When coupling the upper chassis and the lower chassis, the upper EMI gasket and the lower EMI gasket are configured to resiliently contact a portion of the electronic device to provide EMI shielding for the electronic device.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a chassis comprising an upper chassis and a lower chassis, the chassis constructed from a conductive sheet with a first thickness, wherein the upper chassis and the lower chassis are coupled to form an interior of the chassis housing an electronic device;

an upper Electro-Magnetic Interference (EMI) gasket attached to the upper chassis and resiliently contacting a first portion of the electronic device, the upper EMI gasket having a second thickness less than the first thickness, wherein the upper EMI gasket includes perforations to allow cooling air through the upper EMI gasket and into the interior of the chassis; and a lower EMI gasket attached to the lower chassis and resiliently contacting a second portion of the electronic device, the lower EMI gasket being separate from the upper EMI gasket and having the second thickness, wherein the lower EMI gasket includes perforations to allow cooling air through the lower EMI gasket and into the interior of the chassis, and wherein the upper EMI gasket and the lower EMI gasket are configured to provide EMI shielding for the electronic device.

2. The apparatus of claim 1, wherein the second thickness of the upper EMI gasket and the lower EMI gasket allows the perforations to cover at least 90% of the upper EMI gasket and the lower EMI gasket.

3. The apparatus of claim 1, wherein the chassis includes standoffs constructed from the conductive sheet with the first thickness, the standoffs configured to provide structural support to the electronic device.

4. The apparatus of claim 3, further comprising one or more fasteners that couple the upper chassis to the lower chassis through the standoffs.

5. The apparatus of claim 4, wherein the one or more fasteners are electrically conductive to provide additional EMI shielding for the electronic device.

6. The apparatus of claim 3, wherein the upper EMI gasket is attached to the upper chassis through locking tabs coupled to slots in the standoffs.

7. The apparatus of claim 1, wherein the lower EMI gasket is attached to the lower chassis by swaging a portion of the lower chassis to the lower EMI gasket.

8. A system comprising:

a chassis comprising an upper chassis and a lower chassis, the chassis constructed from a conductive sheet with a first thickness, wherein the upper chassis and the lower chassis are coupled to form an interior of the chassis;

an electronic device comprising a motherboard disposed in the interior of the chassis and a daughterboard including a plurality of ports accessible from outside the chassis;

a fan to draw cooling air into the interior of the chassis and cool the electronic device;

an upper Electro-Magnetic Interference (EMI) gasket attached to the upper chassis, the upper EMI gasket having a second thickness less than the first thickness, wherein the upper EMI gasket includes perforations to allow the cooling air through the upper EMI gasket and into the interior of the chassis; and a lower EMI gasket attached to the lower chassis, the lower EMI gasket having the second thickness, wherein the lower EMI gasket includes perforations to allow the cooling air through the lower EMI gasket and into the interior of the chassis, and wherein the upper EMI gasket and the lower EMI gasket are configured to resiliently contact the daughterboard to provide EMI shielding for the electronic device.

9. The system of claim 8, wherein the second thickness of the upper EMI gasket and the lower EMI gasket allows the perforations to cover at least 90% of the upper EMI gasket and the lower EMI gasket.

10. The system of claim 8, wherein the chassis includes standoffs constructed from the conductive sheet with the first thickness, the standoffs configured to provide structural support to the daughterboard.

11. The system of claim 10, further comprising one or more fasteners that couple the upper chassis to the lower chassis through the standoffs.

12. The system of claim 11, wherein the one or more fasteners are electrically conductive to provide additional EMI shielding for the electronic device.

13. The system of claim 10, wherein the upper EMI gasket is attached to the upper chassis through locking tabs coupled to slots in the standoffs.

14. The system of claim 8, wherein the lower EMI gasket is attached to the lower chassis by swaging a portion of the lower chassis to the lower EMI gasket.

15. A method comprising:

mounting an electronic device on a lower chassis constructed of a conductive sheet of a first thickness;

attaching a lower Electro-Magnetic Interference (EMI) gasket to the lower chassis, the lower EMI gasket having a second thickness less than the first thickness, wherein the lower EMI gasket includes perforations to allow cooling air through the lower EMI gasket;

attaching an upper EMI gasket having the second thickness to an upper chassis having the first thickness, wherein the upper EMI gasket is separate from the lower EMI gasket and includes perforations to allow cooling air through the upper EMI gasket; and coupling the upper chassis to the lower chassis to enclose the electronic device, wherein the upper EMI gasket is configured to resiliently contact a first portion of the electronic device and the lower EMI gasket is configured to resiliently contact a second portion of the electronic device to provide EMI shielding for the electronic device.

16. The method of claim 15, further comprising stamping the perforations in the upper EMI gasket and the lower EMI gasket to cover at least 90% of the upper EMI gasket and the lower EMI gasket.

17. The method of claim 15, further comprising forming standoffs from the conductive sheet of the first thickness, the standoffs configured to provide structural support to the electronic device.

18. The method of claim 17, wherein coupling the upper chassis to the lower chassis comprises fastening the upper chassis to the lower chassis through the standoffs.

19. The method of claim 17, wherein attaching the upper EMI gasket to the upper chassis comprises inserting one or more locking tabs formed in the upper EMI gasket into one or more corresponding slots in the standoffs.

20. The method of claim 15, wherein attaching the lower EMI gasket to the lower chassis comprises swaging a portion of the lower chassis to the lower EMI gasket.

* * * * *